(12) United States Patent
Gingrich, III

(10) Patent No.: US 9,985,580 B2
(45) Date of Patent: May 29, 2018

(54) SOLAR JUNCTION BOX FOR SOLAR PANEL

(71) Applicant: Tyco Electronics Corporation, Berwyn, PA (US)

(72) Inventor: Charles Raymond Gingrich, III, Mechanicsburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 116 days.

(21) Appl. No.: 14/729,149

(22) Filed: Jun. 3, 2015

(65) Prior Publication Data

US 2016/0359449 A1    Dec. 8, 2016

(51) Int. Cl.
*H02S 40/34* (2014.01)
*H01L 31/02* (2006.01)
*H01L 31/049* (2014.01)

(52) U.S. Cl.
CPC ........ *H02S 40/34* (2014.12); *H01L 31/02013* (2013.01); *H01L 31/049* (2014.12); *Y02E 10/50* (2013.01)

(58) Field of Classification Search
None
See application file for complete search history.

(56) References Cited

U.S. PATENT DOCUMENTS

2008/0156365 A1* 7/2008 Scholz .................. H01L 31/048
136/251
2013/0003307 A1* 1/2013 Jang ...................... H02S 40/345
361/709

FOREIGN PATENT DOCUMENTS

| EP | 2 506 311 A1 | 10/2012 |
| WO | 2010/014941 A1 | 2/2010 |
| WO | 2014/132166 A1 | 9/2014 |

OTHER PUBLICATIONS

International Search Report, International Application No. PCT/US2016/035374, International Filing Date, Jun. 2, 2016.

\* cited by examiner

*Primary Examiner* — Golam Mowla

(57) ABSTRACT

A solar junction box for a solar panel having a semiconductor layer including at least one photovoltaic cell and a foil electrically connected to the at least one cell, the solar panel having a glass layer above the semiconductor layer and a back sheet below the semiconductor layer includes a housing having walls defining a cavity. The housing is mounted at an edge of the solar panel. A terminal is received in the cavity and is configured to be terminated to the foil. An edge flap extends from the housing. The edge flap has an edge seal configured to be applied to the edge of the solar panel to seal the foil at the edge of the solar panel.

20 Claims, 3 Drawing Sheets

SOLAR JUNCTION BOX FOR SOLAR PANEL

BACKGROUND OF THE INVENTION

The subject matter herein relates generally to solar junction boxes for solar panels.

Photovoltaic (PV) modules or arrays, such as solar panels, produce electricity from solar energy. Electrical power produced by PV modules reduces the amount of energy required from non-renewable resources such as fossil fuels and nuclear energy. Significant environmental benefits are also realized from solar energy production, for example, reduction in air pollution from burning fossil fuels, reduction in water and land use from power generation plants, and reduction in the storage of waste byproducts. Solar energy produces no noise, and has few moving components. Because of their reliability, PV modules also reduce the cost of residential and commercial power to consumers.

PV cells are essentially large-area semiconductor diodes. Due to the photovoltaic effect, the energy of photons is converted into electrical power within a PV cell when the PV cell is irradiated by a light source such as sunlight. PV cells are typically interconnected into solar modules that have power ranges of up to 100 watts or greater. For large PV systems, special PV modules are produced with typical power range of up to several 100 W. A photovoltaic module is the basic element of a photovoltaic power generation system. A PV module has many solar cells interconnected in series or parallel, according to the desired voltage and current parameters. PV cells are connected in series and placed between a back sheet on the bottom and a glass layer on the top. PV cells are interconnected with thin contacts, such as a foil, on the semiconductor layer. The foil is terminated to a junction box, which may electrically connect groups of the PV cells and/or solar panels.

The junction box is typically connected to the back side of the solar panel, such as to the back sheet. The foil exits the semiconductor layer and is terminated to a corresponding terminal in the junction box. However, sealing of the junction box and/or foil are problematic. Additionally, the junction box may block some of the light, reducing the efficiency of the PV module. For example, some PV modules are bifacial panels where reflected sunlight is collected at the backside. Such bifacial panels use a glass layer as the back sheet (e.g., dual glass layer panel) to allow the sunlight to pass through the back sheet to the PV cells at the semiconductor layer. The junction box blocks the reflected sunlight at the backside. Additionally, it is costly to route the foil through the glass layer at the backside, such as by drilling a hole or slot in the glass layer. At least some known PV modules exit the foil at the edge of the solar panel. Heretofore, terminating junction boxes at such locations has proven problematic. For example, portions of the foil are exposed and susceptible to damage and water ingress. Additionally, the glass panels may have various thicknesses and thus no universal solution has been provided for terminating junction boxes to such solar panels.

BRIEF DESCRIPTION OF THE INVENTION

In one embodiment, a solar junction box is provided for a solar panel having a semiconductor layer including at least one photovoltaic cell and a foil electrically connected to the at least one cell, the solar panel having a glass layer above the semiconductor layer and a back sheet below the semiconductor layer. The solar junction box includes a housing having walls defining a cavity. The housing is configured to be mounted at an edge of the solar panel. A terminal is received in the cavity and is configured to be terminated to the foil. An edge flap extends from the housing. The edge flap has an edge seal configured to be applied to the edge of the solar panel to seal the foil at the edge of the solar panel.

In another embodiment, a solar junction box is provided for a solar panel having a semiconductor layer including at least one photovoltaic cell and a foil electrically connected to the at least one cell, the solar panel having a glass layer above the semiconductor layer and a back sheet below the semiconductor layer. The solar junction box includes a housing having side walls and end walls defining a cavity. The housing is configured to be mounted to the back sheet at an edge of the solar panel near a foil exit where the foil exits the solar cell from between the glass layer and the back sheet. A terminal is received in the cavity that is configured to be terminated to the foil. An edge flap extends from the housing. The edge flap has a side wall and an end wall oriented generally perpendicular to the side wall. The side wall extends along and seal against the edge of the solar panel and the end wall extends along and seals against the glass layer. The edge flap has an edge seal configured to be applied to the edge of the solar panel at the foil exit to seal the foil at the edge of the solar panel.

In a further embodiment, a photovoltaic system is provided including a solar panel having a semiconductor layer including at least one photovoltaic cell and a foil electrically connected to the at least one cell. The solar panel has a glass layer above the semiconductor layer and a back sheet below the semiconductor layer. The solar panel has an edge and the foil exits the edge at a foil exit. The photovoltaic system also includes a solar junction box coupled to the solar panel. The solar junction box includes a housing having side walls and end walls defining a cavity. The housing is mounted to the solar panel at the edge near the foil exit. A terminal is received in the cavity and is terminated to the foil. An edge flap extends from the housing. The edge flap has an edge seal applied to the edge of the solar panel to seal the foil at the foil exit.

DETAILED DESCRIPTION OF THE INVENTION

Figure 1:
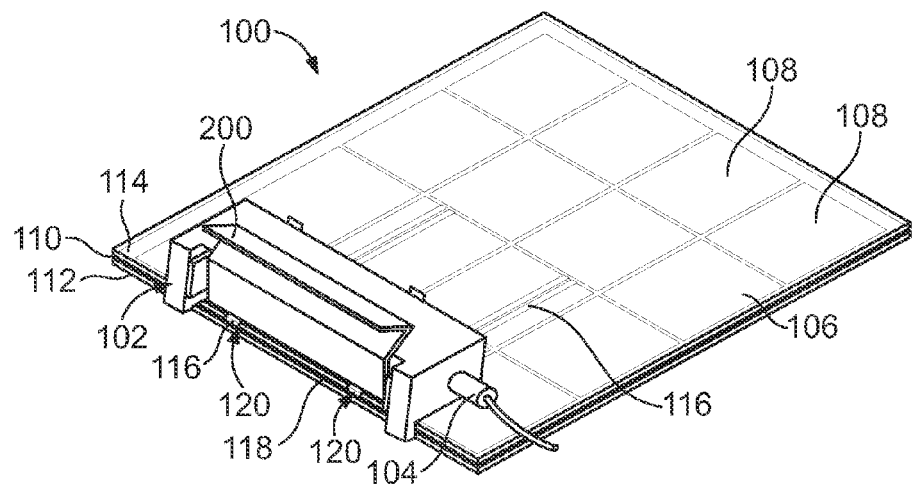
FIG. 1 illustrates a photovoltaic (PV) system formed in accordance with an exemplary embodiment.

FIG. 1 illustrates a photovoltaic (PV) system 100 formed in accordance with an exemplary embodiment. The PV system 100 includes one or more solar junction boxes 102 (one shown in FIG. 1), which may be electrically connected by connector assemblies 104 (e.g., cable connector assemblies). The PV system 100 includes a plurality of PV components 106. In an exemplary embodiment, the PV components 106 may be any type of PV components, such as PV modules or arrays that are used to generate electricity, such as solar panels, or other PV components used within the PV system 100 such as power storage devices, sensors, controllers, and the like. In the illustrated embodiment, the PV components 106 are solar panels and may be referred to hereinafter as solar panels 106. The solar panels 106 have a plurality of PV cells 108 configured to generate electricity.

The connector assemblies 104 may be coupled solar junction boxes 102 of the same solar panel 106 or solar junction boxes 102 of different solar panels 106. The connector assemblies 104 transmit power and/or data along the transmission path between the PV components 106.

In an exemplary embodiment, the solar panel 106 includes a semiconductor layer 110 sandwiched between a glass layer 112 and a back sheet 114. The glass layer 112 may define a top layer of the solar panel 106 and the back sheet 114 may define a bottom layer of the solar panel 106. The semiconductor layer 110 includes the cells 108 and conductors, such as conductive foils 116, connecting the cells 108 in series. Optionally, one or more EVA layers (e.g., thermoplastic containing ethylene vinyl acetate) may be used, such as a layer used to encapsulate the PV cells 108. The foils 116 may be bus ribbons electrically connecting the cells and the solar junction box 102. Groups of the cells 108 may be electrically connected to the corresponding solar junction box 102. For example, the foil 116 may be terminated to a corresponding terminal in the solar junction box 102. In an exemplary embodiment, the solar junction box 102 is mounted to the solar panel 106 at an edge 118 of the solar panel 106. The foils 116 may extend from the edge to the solar junction box 102.

The glass layer 112 is positioned above the semiconductor layer 110 and allows sunlight to pass therethrough to the cells 108. The back sheet 114 is positioned below the semiconductor layer 110. The back sheet 114 may be a plastic layer. Alternatively, the back sheet 114 may be manufactured from another material. For example, the back sheet 114 may be another glass layer. For example, in some various embodiments, the solar panel 106 may be a bifocal solar panel configured to receive sunlight from both sides of the solar panel 106. For example, the backside (back sheet 114) may receive reflective sunlight. The foils 116 from the semiconductor layer 110 exit the solar panel 106 at foil exits 120 at the edge 118. The foil exits 120 are between the glass layer 112 and the back sheet 114. The foils 116 are routed to the solar junction box 102, which, in the illustrated embodiment, is mounted to the backside of the solar panel 106, such as to the back sheet 114.

The solar junction box 102 includes an edge flap 200 (shown in an open position in FIG. 1) used to cover and seal the foils 116. The edge flap 200 accommodates various thicknesses of the solar panel 106. While FIG. 1 is a bottom perspective view showing the solar junction box 102 mounted to the back sheet 114, in use, the glass layer 112 would be on top or upward facing to face the sun and the solar junction box 102 would be mounted to the backside of the solar panel 106. Other orientations are possible and terms denoting orientation (e.g., top, bottom, up, down, etc.) may be relative to the orientation shown in the particular Figure as opposed to an orientation in use.

Figure 2:
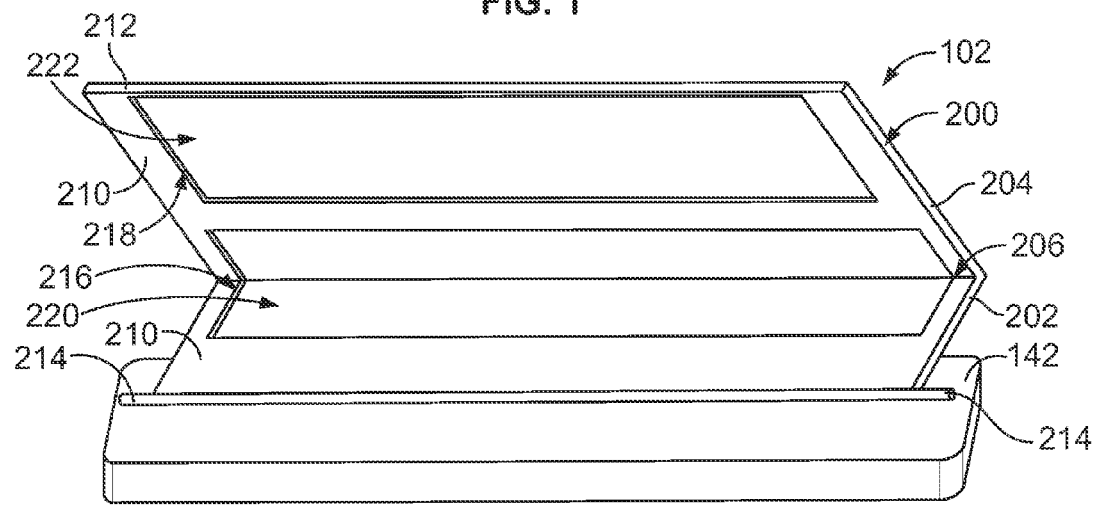
FIG. 2 is a partially exploded view of a solar junction box of the PV system formed in accordance with an exemplary embodiment.
Figure 2:
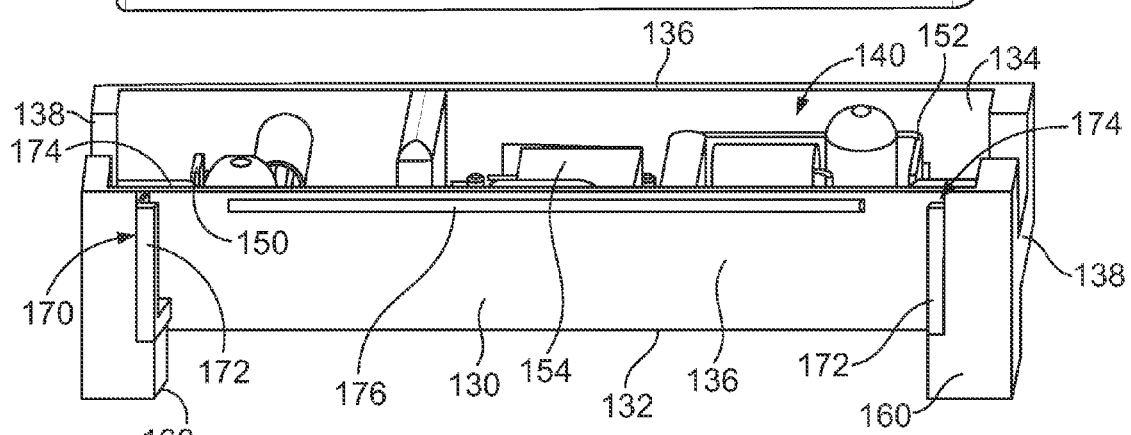

FIG. 2 is a partially exploded view of the solar junction box 102 formed in accordance with an exemplary embodiment. The solar junction box 102 includes a housing 130 configured to be mounted to the solar panel 106. The housing 130 includes a base 132 and a plurality of walls 134 extending from the base 132. Any number of walls 134 may be provided to provide an appropriate shaped housing for the particular application. In the illustrated embodiment, the walls 134 include side walls 136 and end walls 138 extending between the side walls 136. Optionally, the housing 130 may have a rectangular cross section, being long and narrow, with the side walls 136 longer than the end walls 138. Other shapes are possible in alternative embodiments.

The side walls 136 and end walls 138 define a cavity 140 of the housing 130. The solar junction box 102 also includes a lid or cover 142. The solar junction box 102 holds electrical components configured to be electrically connected to one or more of the foils 116 in the cavity 140. The cover 142 covers the cavity 140 and electrical components. In an exemplary embodiment, the solar junction box 102 includes a positive terminal 150 and a negative terminal 152 in the cavity 140. In an exemplary embodiment, the solar junction box 102 includes a bypass diode 154 between the terminals 150, 152. The solar junction box 102 may include other electrical components in alternative embodiments. The positive terminal 150 is terminated to a corresponding foil 116 and the negative terminal 152 is terminated to a corresponding foil 116. The terminals 150 and/or 152 may be terminated to other components, such as electrical connectors or cables.

In an exemplary embodiment, the solar junction box 102 includes edge alignment features 160 extending from the base 132. The edge alignment features 160 may be provided at one of the side walls 136. The edge alignment features 160 are configured to engage the edge 118 (shown in FIG. 1) of the solar panel 106 to align the solar junction box 102 at the edge 118 of the solar panel 106. In the illustrated embodiment, the edge alignment features 160 are tabs or posts extending from the base 132. A pair of the edge alignment features 160 are provided each being at or near opposite end walls 138. Any number of edge alignment features 160 may be provided in alternative embodiments.

In an exemplary embodiment, the solar junction box 102 includes a track 170 along one of the side walls 136 (e.g., the same side wall 136 having the edge alignment features 160). The track 170 receives the edge flap 200. The track 170 may be open at the top opposite the base 132. Optionally, the track 170 is defined by a pair of rails 172 at opposite sides of the track 170. The rails 172 may be provided at the end walls 138. The rails 172 form slots 174 along the corresponding side wall 136. Optionally, the solar junction box 102 may have a retainer 176 at or near the top. The retainer 176 may hold the edge flap 200 in the track 170. The edge flap 200 rides vertically up and down within the track 170 and the retainer 176 may ensure that the edge flap 200 is held in the track 170. The track 170 may be closed at the bottom or base of the track 170.

The edge flap 200 is used to cover the edge 118 of the solar panel 106. The edge flap 200 is used to seal the foils 116 at the corresponding foil exits 120 (both shown in FIG. 1). In an exemplary embodiment, the edge flap 200 includes a side wall 202 and an end wall 204 meeting at a corner 206. Optionally, the end wall 204 may be generally perpendicular with respect to the side wall 202. The edge flap 200 includes an interior 210 configured to face the solar panel 106 in an exterior 212 opposite the interior 210.

In an exemplary embodiment, the edge flap 200 includes pins 214 extending from the side wall 202. Optionally, the pins 214 may be located at opposite edges of the side wall 202. The pins 214 are configured to be received in corresponding rails 172 of the track 170. In an exemplary embodiment, the pins 214 may ride along the rails 172 within the track 170. As such, the edge flap 200 is configured to be slidably coupled to the housing 130 within the track 170. In an exemplary embodiment, the edge flap 200 is rotatable about the pins 214 within the track 170. As such, the edge flap 200 may be rotated relative to the housing 130.

In an exemplary embodiment, the edge flap 200 includes one or more recesses 216 formed in the interior 210. For example, the edge flap 200 includes a recess 216 along the side wall 202 and/or along the end wall 204. For example, the first recess 216 may span across the corner 206 from the side wall 202 to the end wall 204. The edge flap 200 may include a second recess 218 in the end wall 204. The first recess 216 is configured to receive an edge seal 220 that may seal the edge flap 200 to the edge 118 of the solar panel 106. Optionally, the edge seal 220 may be a silicon sealant applied to the recess 216. Other types of edge seals may be provided in alternative embodiments, such as epoxy, a gasket, or another type of sealer. In an exemplary embodiment, adhesive tape 222, such as double sided tape, may be provided in the second recess 218. The tape 222 may be used to initially hold the edge flap 200 in a closed position against the solar panel 106 until the edge seal 220 can be applied and sealed against the solar panel 106.

Figure 3:
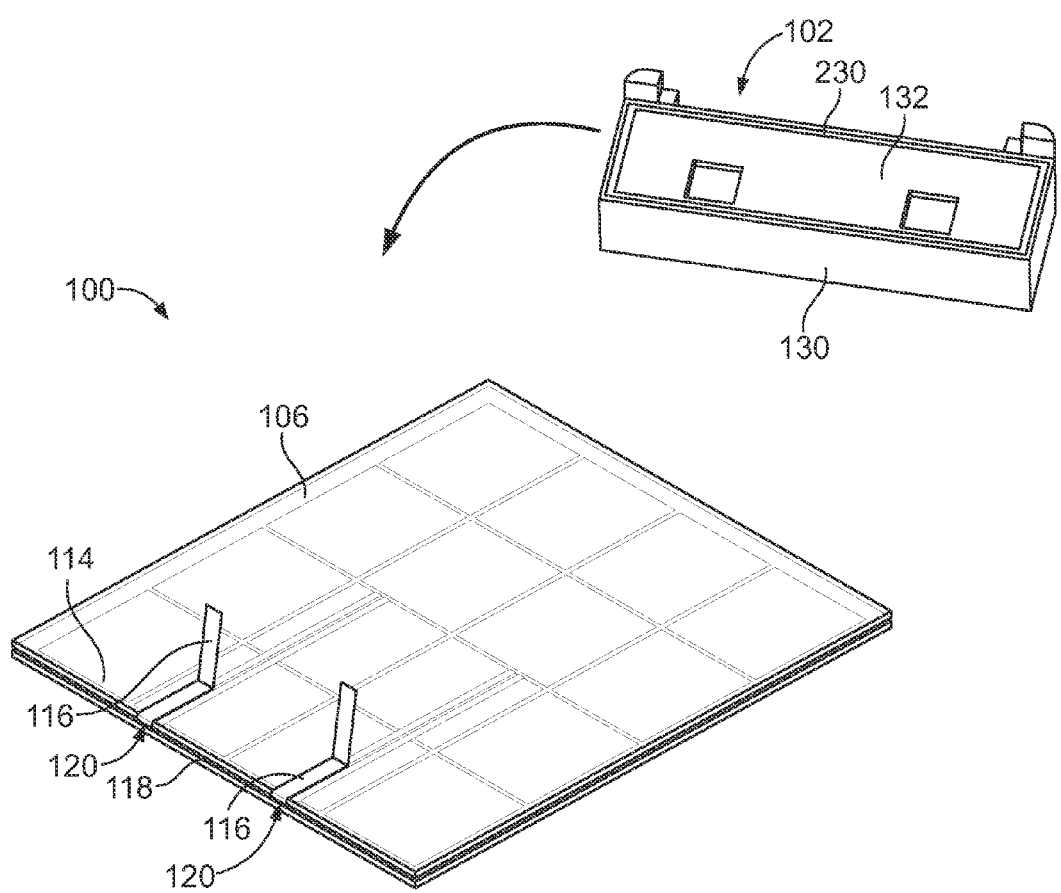
FIG. 3 illustrates the PV system showing the solar junction box poised for mounting to a solar panel of the PV system.

FIG. 3 illustrates the PV system 100 showing the solar junction box 102 poised for mounting to the solar panel 106. The foils 116 exit the solar panel 106 at the edge 118 at foil exits 120. The foils 116 are wrapped along the edge 118 around the back sheet 114. The foils 116 extend along the outer surface of the back sheet 114 and are bent away from the solar panel 106 for loading into the solar junction box 102 when the solar junction box 102 is mounted to the solar panel 106. The solar junction box 102 includes a base seal 230 applied to the base 132 of the housing 130. The base seal 230 is used to mount the solar junction box 102 to the solar panel 106. For example, the foils 116 may pass through foil openings in the solar junction box 102.

The base seal 230 seals the base 132 to the outer surface of the back sheet 114. Optionally, the base seal 230 may be a silicon adhesive. The base seal 230 may be received in a pocket in the base 132. Optionally, adhesive tape, such as double sided tape may be applied to the base 132 to hold the solar junction box 102 in place on the solar panel 106 while the base seal 230 cures or sets.

Figure 4:
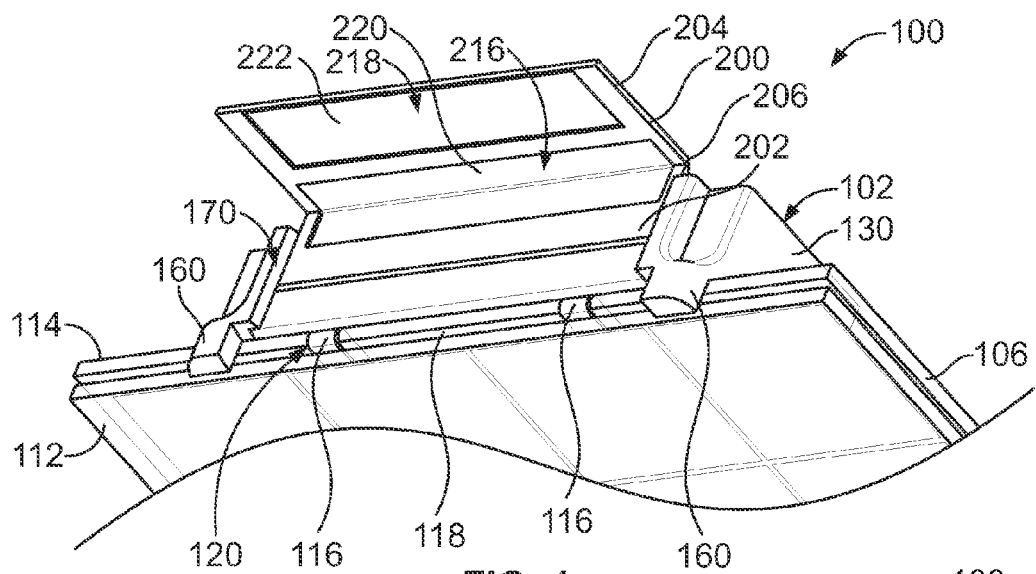
FIG. 4 illustrates a portion of the PV system showing the solar junction box mounted to the solar panel with an edge flap of the solar junction box in an open position.
Figure 5:
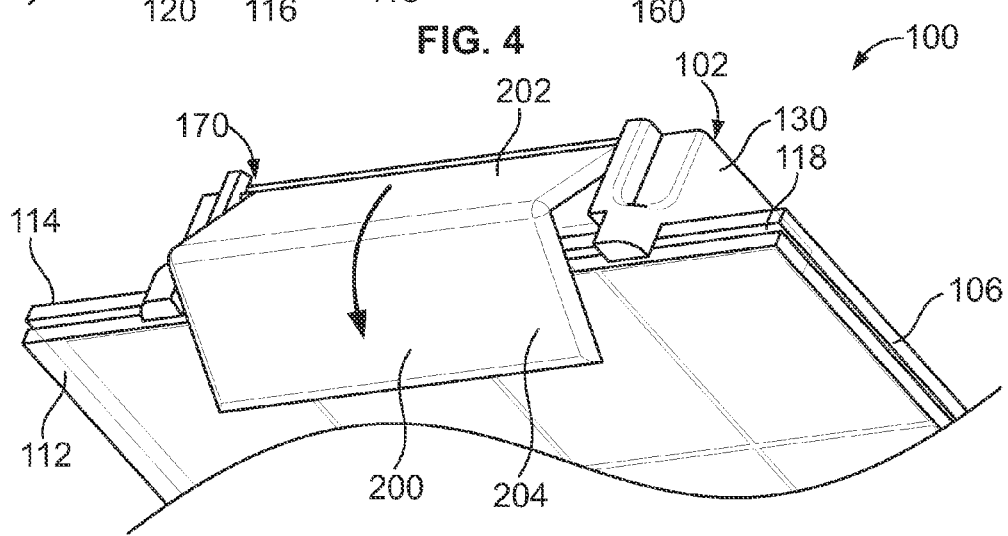
FIG. 5 is another view of the PV system showing the edge flap in a partially closed position.
Figure 6:
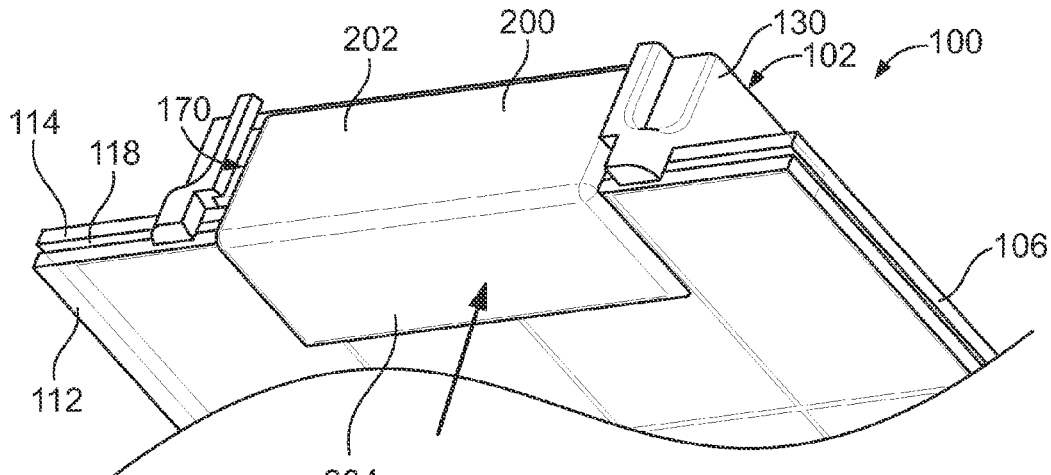
FIG. 6 is another view of the PV system showing the edge flap in a closed position.

FIG. 4 illustrates a portion of the PV system 100 showing the solar junction box 102 mounted to the solar panel 106. FIG. 4 illustrates the edge flap 200 in an open position. FIG. 5 is another view of the PV system 100 showing the edge flap 200 in a partially closed position. FIG. 6 is another view of the PV system 100 showing the edge flap 200 in a closed position. The solar junction box 102 is coupled to the solar panel 106 at or near the edge 118. The edge alignment features 160 engage the edge 118 of the solar panel 106 to align the solar junction box 102 with the solar panel 106. The solar junction box 102 covers the foils 116 where the foils 116 extend along the back sheet 114. The foils 116 may be routed into the solar junction box 102 for electrical termination therein.

During assembly, the edge flap 200 is initially held in the open position (FIG. 4). The edge seal 220 may be applied to the edge flap 200, such as in the recess 216. The edge seal 220 is applied in an area that will seal the edge flap 200 to the edge 118 and to the foils 116 at the foil exit 120. Optionally, the tape 222 may be applied to the edge flap 200, such as in the recess 218. The liner on the tape 222 may be peeled back to ready the edge flap 200 for attachment to the solar panel 106.

The edge flap 200 is slidably received in the track 170 and is rotatable relative to the housing 130. As the edge flap 200 is closed, the edge flap 200 may be rotated in a closing direction (FIG. 5). The edge flap 200 is rotated around the edge 118 of the solar panel 106 such that the end wall 204 wraps around the edge 118 and is positioned along the glass layer 112. The edge flap 200 may be rotated closed until the side wall 202 abuts against the edge 118 of the solar panel 106. The side wall 202 covers the edge 118 and the foils 116 at the foil exit 120 in the closed position. The side wall 202 covers the foils 116 as the foils 116 extend along the edge of the back sheet 114. The edge seal 220 may seal the foils 116 to protect the foils 116 from environmental degradation, such as from water.

Once the edge flap 200 is rotated to a generally closed position (FIG. 6) with the sidewall 202 abutting against the solar panel 106, the edge flap 200 may be pushed closed by pushing the end wall 204 against the glass layer 112. The edge flap 200 is slidable within the track 170 and may be slid until the end wall 204 abuts against the exterior of the glass layer 112. The corner 206 spans the corner of the glass layer 112. The edge seal 220 at the end wall 204 is pressed against the glass layer 112. The tape 222 initially holds the edge flap 200 in place in the closed position. The tape 222 temporarily holds the edge flap 200 until the edge seal 220 cures or sets. Once the edge seal 220 cures, the edge seal 220 permanently holds the edge flap 200 in place on the solar panel 106. The edge seal 220 provides a permanent mechanical connection for the edge flap 200 to the solar panel 106. The edge seal 220 also seals the edge 118 and the foils 116.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A solar junction box for a solar panel having a semiconductor layer including at least one photovoltaic cell and a foil electrically connected to the at least one cell, the solar panel having a glass layer above the semiconductor layer and a back sheet below the semiconductor layer, the solar junction box comprising:

a housing having a base, a first side wall extending from the base and end walls extending from the base at opposite ends of the first side wall, the base, first side wall and the end walls defining a cavity, the base of the housing being configured to be mounted at the back sheet proximate to an edge of the solar panel such that the first side wall is generally aligned along the edge of the solar panel;

a terminal received in the cavity, the terminal being configured to be terminated to the foil; and an edge flap pivotably coupled to the housing at the first side wall, the edge flap extending the length of the side wall between the end walls and extending from the housing to wrap around the edge of the solar panel to the glass layer of the solar panel, the edge flap having an edge seal configured to be applied to the edge of the solar panel when the edge flap is pivoted against the edge of the solar panel to seal the foil at the edge of the solar panel.

2. The solar junction box of claim 1, wherein the edge flap is slidably coupled to the housing.

3. The solar junction box of claim 1, wherein the edge flap extends along the edge of the solar panel and along the glass layer such that a portion of the solar panel is positioned between a base of the housing and the edge flap.

4. The solar junction box of claim 1, wherein the edge flap includes a side wall and an end wall oriented generally perpendicular to the side wall, the side wall extending along the edge, the end wall extending along the glass layer, the edge seal being applied to at least the side wall to seal the foil at the edge of the solar panel.

5. The solar junction box of claim 1, wherein the housing includes a track on one of the walls, the edge flap being received in the track and being movable in the track.

6. The solar junction box of claim 1, wherein the edge flap includes pins, the pins being coupled to the end walls of the housing, the edge flap being rotatable about the pins.

7. The solar junction box of claim 1, wherein the edge seal is a silicone sealant.

8. The solar junction box of claim 1, wherein the edge flap includes a recess, the edge seal being received in the recess.

9. A solar junction box for a solar panel having a semiconductor layer including at least one photovoltaic cell and a foil electrically connected to the at least one cell, the solar panel having a glass layer above the semiconductor layer and a back sheet below the semiconductor layer, the solar junction box comprising:

a housing having a base, side walls and end walls defining a cavity, the base of the housing being configured to be mounted to the back sheet at an edge of the solar panel near a foil exit where the foil exits the solar cell from between the glass layer and the back sheet such that one of the side walls is generally aligned along the edge of the solar panel, the base configured to extend along and seal against the back sheet;

a terminal received in the cavity, the terminal being configured to be terminated to the foil; and an edge flap pivotably coupled to the housing at one of the side walls, the edge flap extending the length of the corresponding side wall between the end walls and extending from the housing to wrap around the edge of the solar panel to the glass layer of the solar panel, the edge flap having a side wall and an end wall oriented generally perpendicular to the side wall, the side wall configured to extend along and seal against the edge of the solar panel, the end wall configured to extend along and seal against the glass layer, the edge flap having an edge seal configured to be applied to the edge of the solar panel at the foil exit to seal the foil at the edge of the solar panel.

10. The solar junction box of claim 9, wherein the edge flap is slidably coupled to the housing.

11. The solar junction box of claim 9, wherein the housing includes a track on one of the side walls, the edge flap being received in the track and being slidable in the track.

12. The solar junction box of claim 9, wherein the edge flap includes pins, the pins being coupled to the housing, the edge flap being rotatable about the pins.

13. The solar junction box of claim 9, wherein the edge seal is a silicone sealant.

14. The solar junction box of claim 9, wherein the edge flap includes a recess, the edge seal being received in the recess.

15. A photovoltaic system comprising:

a solar panel having a semiconductor layer including at least one photovoltaic cell and a foil electrically connected to the at least one cell, the solar panel having a glass layer above the semiconductor layer and a back sheet below the semiconductor layer, the solar panel having an edge, the foil exiting the edge at a foil exit; and a solar junction box comprising:

a housing having side walls and end walls defining a cavity, the housing being mounted to the solar panel at the edge near the foil exit such that one of the side walls is generally aligned along the edge of the solar panel;

a terminal received in the cavity, the terminal being terminated to the foil; and an edge flap pivotably coupled to the housing at one of the side walls, the edge flap extending the length of the corresponding side wall between the end walls and extending from the housing to wrap around the edge of the solar panel to the glass layer of the solar panel, the edge flap having an edge seal applied to the edge of the solar panel to seal the foil at the foil exit.

16. The photovoltaic system of claim 15, wherein the edge flap is slidably coupled to the housing.

17. The photovoltaic system of claim 15, wherein the edge flap extends along the edge of the solar panel and along the glass layer such that a portion of the solar panel is positioned between a base of the housing and the edge flap.

18. The photovoltaic system of claim 15, wherein the edge flap includes a side wall and an end wall oriented generally perpendicular to the side wall, the side wall extending along the edge, the end wall extending along the glass layer, the edge seal being applied to at least the side wall to seal the foil at the edge of the solar panel.

19. The photovoltaic system of claim 15, wherein the housing includes a track on one of the side walls, the edge flap being received in the track and being movable in the track.

20. The photovoltaic system of claim 15, wherein the edge flap includes pins, the pins being coupled to the housing, the edge flap being rotatable about the pins.

* * * * *